(12) United States Patent
Song et al.

(10) Patent No.: US 6,451,691 B2
(45) Date of Patent: Sep. 17, 2002

(54) METHODS OF MANUFACTURING A METAL PATTERN OF A SEMICONDUCTOR DEVICE WHICH INCLUDE FORMING NITRIDE LAYER AT EXPOSED SIDEWALLS OF TI LAYER OF THE PATTERN

(75) Inventors: Won-Sang Song, Seoul; In-Sun Park, Gyeonggi-do; Kyung-Bum Koo, Gyeonggi-do; Young-Cheon Kim, Gyeonggi-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/794,616

(22) Filed: Feb. 28, 2001

(30) Foreign Application Priority Data

Jun. 28, 2000 (KR) .............................. 00-35892

(51) Int. Cl.⁷ .............................................. H01L 21/44
(52) U.S. Cl. ....................... 438/653; 438/654; 438/656; 438/660; 438/663; 438/669
(58) Field of Search ................................ 438/656, 653, 438/654, 660, 663, 669, 685

(56) References Cited

U.S. PATENT DOCUMENTS

| 5,310,456 | A |   | 5/1994 | Kadomura ............... 156/657 |
|---|---|---|---|---|
| 5,314,576 | A |   | 5/1994 | Kadomura ............... 156/655 |
| 5,705,428 | A |   | 1/1998 | Liu et al. ............... 437/192 |
| 5,754,390 | A | * | 5/1998 | Sandhu et al. .......... 361/321.4 |
| 5,998,824 | A | * | 12/1999 | Lee .......................... 257/309 |
| 6,187,674 | B1 | * | 2/2001 | Chen et al. ............. 438/653 |
| 6,191,033 | B1 | * | 2/2001 | Liao et al. .............. 438/653 |
| 6,229,171 | B1 | * | 5/2001 | Chun et al. ............. 257/296 |
| 6,277,745 | B1 | * | 8/2001 | Liu et al. ............... 438/687 |

FOREIGN PATENT DOCUMENTS

| JP | 62-32610 |   | 2/1987 |   |
|---|---|---|---|---|
| JP | 62-283625 |   | 12/1987 |   |
| JP | 5-343363 |   | 12/1993 |   |
| JP | 8-288390 A | * | 11/1996 | ......... H01L/21/768 |

\* cited by examiner

*Primary Examiner*—Keith Christianson
*Assistant Examiner*—Stephen W. Smoot
(74) *Attorney, Agent, or Firm*—Volentine Francos, PLLC

(57) ABSTRACT

A method of manufacturing a metal pattern of a semiconductor device. A Ti layer and a metal layer are successively formed on a semiconductor substrate or on an insulating layer. Then, a wiring pattern including a Ti layer pattern and a metal layer pattern is formed by patterning said Ti layer and the metal layer. Heat treating is employed under an atmosphere of a compound including nitrogen in order to react an exposed portion of the Ti layer pattern to form TiN as a main product, thereby increasing the stability and adhesiveness of the metal layer for subsequent processes.

18 Claims, 8 Drawing Sheets

METHODS OF MANUFACTURING A METAL PATTERN OF A SEMICONDUCTOR DEVICE WHICH INCLUDE FORMING NITRIDE LAYER AT EXPOSED SIDEWALLS OF TI LAYER OF THE PATTERN

BACKGROUND OF THE INVENTION

1. Field of the Invention

The present invention relates to a method of manufacturing a metal pattern of a semiconductor device, and more particularly, to a method of manufacturing a metal pattern of a semiconductor device which has improved stability and adhesiveness for subsequent processes.

2. Description of the Related Art

Semiconductor devices require high capacity and fast operating speeds to power today's electronic devices. Accordingly, semiconductor device manufacturing methods continually strive to improve the integration density, reliability, and response times of the devices.

However, as the integration density increases and the overall size of the device itself decreases, limitations are encountered. For example, as the critical dimension of the device is reduced to sub-micron size or less in order to increase the integration density, the channel lengths, distances between active regions, sizes of via holes or studs, contact areas between metals, etc. are reduced. This causes various problems, such as short channel effect (SCE) or stability, with regard to a transistor for example. Also, problems concerning resistance, stability, or adhesiveness between layers are generated as the critical dimension of metal patterns is reduced. The stability or adhesiveness of the metal pattern may deteriorate during the implementing processes to form a metal pattern after depositing a metal, or due to an indirect influence of a subsequent process.

Figure 1A:
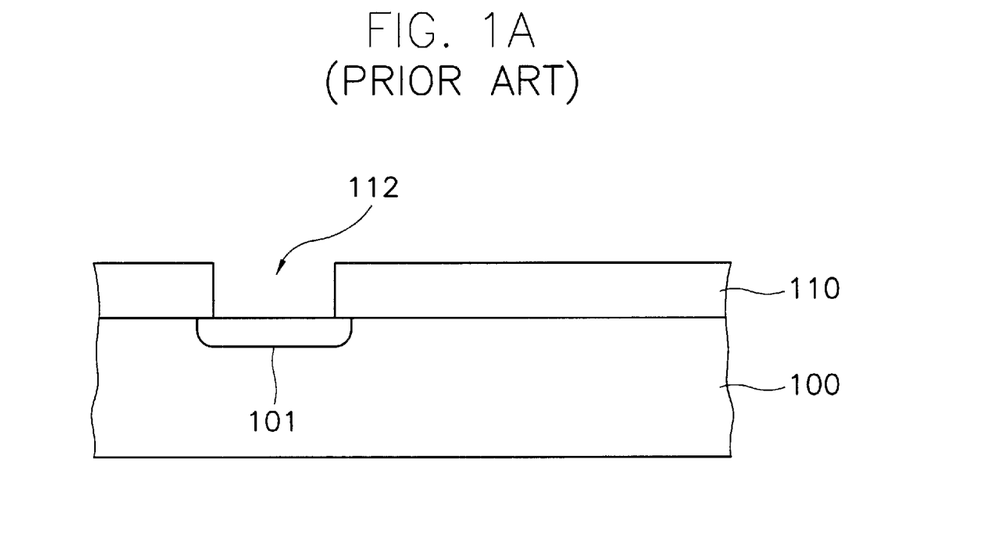
FIGS. 1A–1D are cross-sectional views showing a conventional method of manufacturing a metal pattern of a semiconductor device.

FIGS. 1A to 1D are schematic cross-sectional views illustrating the conventional method of manufacturing a metal pattern of a semiconductor device. Referring to FIG. 1A, an insulating layer 110 comprising silicon oxide is formed on a semiconductor substrate 100 having an impurity doped region 101. An opening 112 which exposes the impurity doped region 101 is formed in the insulating layer 110 by a photolithography process.

Figure 1B:
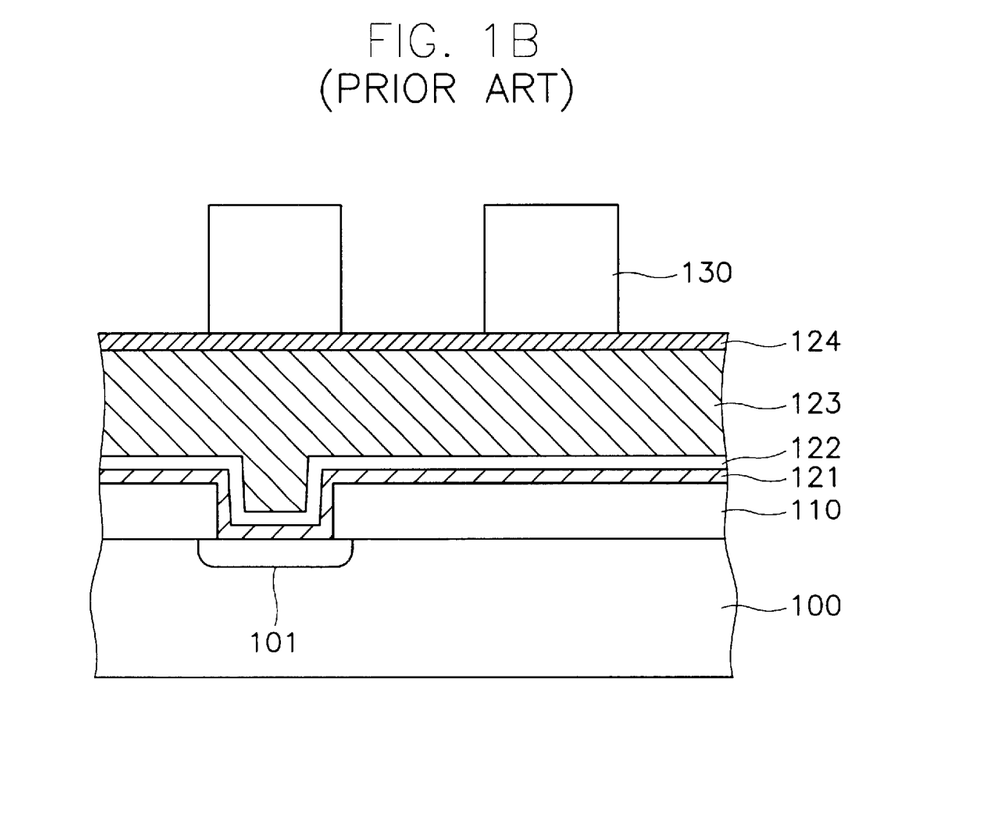

FIG. 1B illustrates the processes for forming a metal pattern. First, a Ti (titanium) layer 121 is formed by depositing Ti by a sputtering or a CVD method to a thickness about 30–500 Å. The Ti layer 121 is formed to improve adhesiveness between a subsequently deposited metal material and the underlying silicon oxide layer. On the Ti layer 121, a TiN (titanium nitride) layer 122 is formed as a barrier layer to thickness of about 50–2000 Å. The TiN layer 122 is formed to prevent an impregnation of a subsequently deposited metal material to form a metal layer contacting the underlying active region. Thereafter, a metal such as tungsten, aluminum, or the like is deposited to a thickness of about 300–8000 Å to form a metal layer 123, and an SiN (silicon nitride) layer 124 is then deposited on metal layer 123.

The SiN layer 124 is formed by depositing SiN using a low pressure chemical vapor deposition (LPCVD) method. The LPCVD is a deposition method for forming thin films using a chemical reaction by employing heat energy in a reaction vessel where the pressure is maintained at about 200–700 torr. The LPCVD is performed by heat-treating at about 400–600° C. with a mixed gas of $SiH_4$ and $N_2$, or a mixed gas of $SiH_4$ and $N_2O$ as source gases. With this method, the uniformity and step coverage of the resulting film is good and a large number of wafers can be processed at once.

Figure 1C:
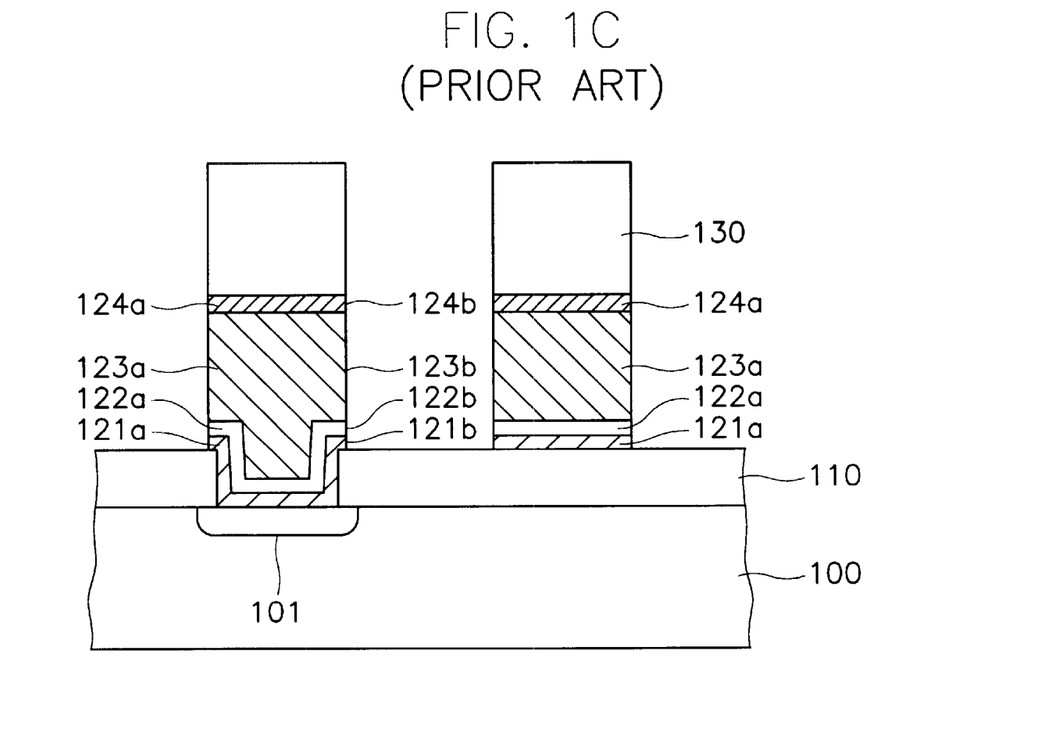

Referring to FIG. 1C, an anisotropic etching from the upper layer is implemented by using a photoresist pattern 130 as an etching mask to form a desired pattern. Beneath the photoresist pattern 130, an SiN pattern 124a, a metal layer pattern 123a, a TiN pattern 122a and a Ti pattern 121a are successively formed. The SiN pattern 124a formed on the metal layer pattern 123a functions as an anti-reflective layer during a subsequent photolithography process, and it also reinforces shoulders of SiN spacers formed on both sidewalls of the metal pattern. After implementing this etching, note that sidewalls of each pattern (Ti pattern sidewalls 121b, TiN pattern sidewalls 122b, metal layer pattern sidewalls 123b, and SiN pattern sidewalls 124b) are exposed.

Figure 1D:
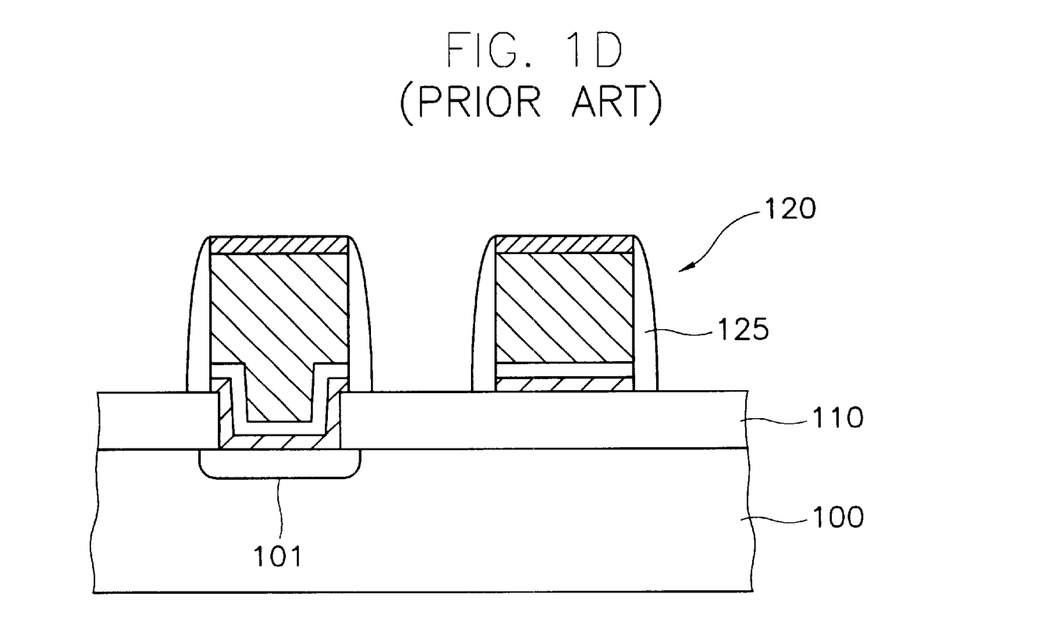

Referring to FIG. 1D, the photoresist pattern 130 is removed and SiN is deposited on the thus obtained pattern. An etch back process is implemented to form SiN spacers 125 on side walls of the patterns to prevent an oxidation of a metal, and to implement a self aligned contact hole (SAC) process to manufacture a metal pattern 120. The LPCVD deposition parameters for forming the SiN spacers 125 are the same as those for the SiN layer 124.

The SAC process is briefly explained as follows. Present semiconductor devices have a design rule of 0.15 μm or less, and accordingly, the critical dimension is reduced and contact holes must be formed in even thicker interlayer dielectric layers. As a result, it becomes difficult to maintain the process margins during the formation of the contact hole, and in order to ensure the process margin, spacers are formed on the side walls of the pattern. Essentially, the spacer secures the process margin and is called a shoulder margin.

During the manufacturing process of the metal pattern, the following factors may influence the characteristics of the metal layer.

A defect may be generated by a thermal budget on the metal layer during the spacer forming process after forming the metal pattern. Also, the thermal budget may generate gases from layers surrounding the metal layer, such as an insulating layer. The gases, for example, oxygen, humidity, etc., can function as oxidizing agents and potentially oxidize surrounding exposed metal, especially an exposed portion of the Ti pattern which has a high reactivity. If so, the adhesiveness and the stability of the metal pattern is reduced. If a subsequent metal layer pattern having a strong stress characteristic is formed on the oxidized Ti pattern, a separation of a portion of the Ti layer can be induced if the applied stress is larger than a critical value at an edge portion of the Ti pattern.

Figure 2:
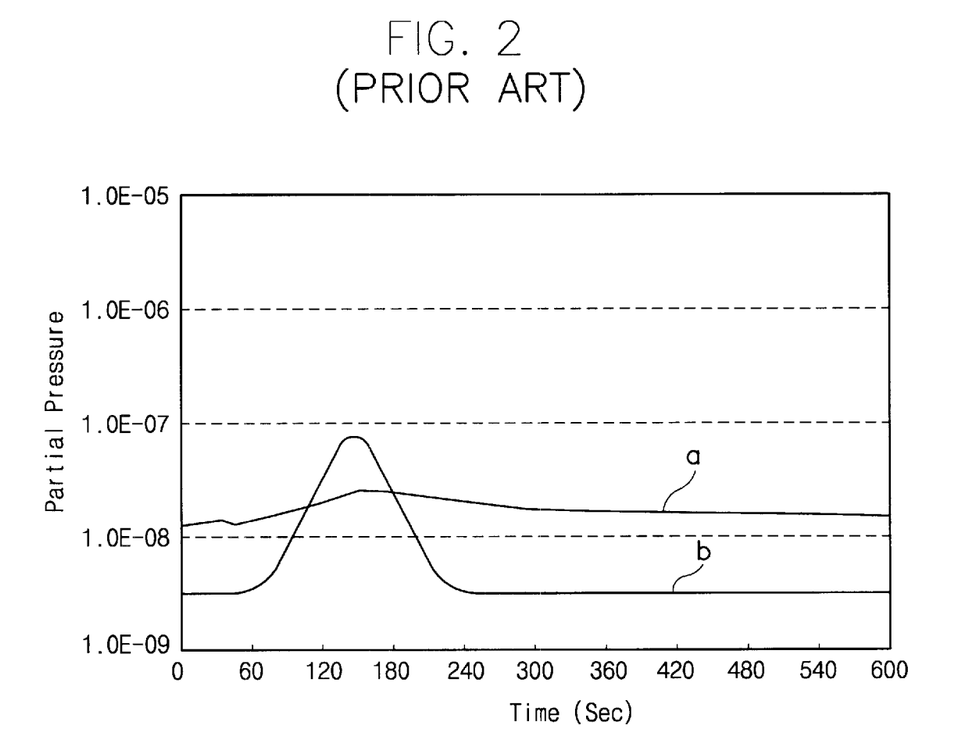
FIG. 2 is a graph obtained by detecting the amount of gas generated from an insulating layer during a heat treatment for the formation of a subsequent layer.

FIG. 2 illustrates graphs obtained by detecting amounts of gases generated from an insulating layer during a heat treatment for the formation of a subsequent layer. In FIG. 2, 'a' corresponds to H₂O gas and 'b' corresponds to O₂ gas when the insulating layer (silicon oxide layer) is formed and as the subsequent layer (SiN layer) is formed. FIG. 2 confirms that an appreciable amount of oxidizing gases are generated during the heat treatment. The gas generated from one wafer does not induce considerable problem; however, when a process is implemented for about ten wafers simultaneously, the proportional increase in gas generated might induce a lifting of the metal pattern.

In order to solve the above-mentioned problem, various methods have been suggested. U.S. Pat. Nos. 5,310,456 and 5,314,576, both issued to Kadomura, disclose a process for protecting side walls of a metal pattern by using a protecting layer. However, this method costs a great deal, is inefficient, and is difficult to implement in a practical way.

U.S. Pat. No. 5,705,428, issued to Liu et al., discloses a method of forming a nitride layer on side walls of a metal pattern by injecting additional N₂ gas during a typical etching process. However, the additional injected N₂ gas produces undesirable polymer residues, and the etching efficiency and etching ratio are reduced. Furthermore, a high vacuum environment is required during the etching when utilizing some types of equipment, but the addition of N₂ gas deteriorates the etching.

In another method, H₂O is added during an ashing process using oxygen to form a metal oxide at an edge portion of the metal layer. However, the oxide compound is not uniformly formed, but is partially formed depending on the type of the metal, the grain sizes of the metal, and the quality of the interface of the metal. Accordingly, the control of the formation of the oxide layer is difficult and sometimes this oxide layer weakens the adhesiveness of the metal.

SUMMARY OF THE INVENTION

It is an object of the present invention to provide an advantageous method of manufacturing a metal pattern of a semiconductor device having improved stability and adhesiveness by solving the above-mentioned problems during the manufacturing thereof.

To accomplish this object, a method of manufacturing a metal pattern of a semiconductor device is provided. First, a Ti layer and a metal layer are successively formed on a semiconductor substrate or on an insulating layer. Then, a wiring pattern including a Ti layer pattern and a metal layer pattern is formed by patterning the Ti layer and the metal layer. An exposed portion of the Ti layer pattern forms TiN as a main product by implementing a heat treatment process under an atmosphere of a compound including nitrogen.

There is also provided a method of manufacturing a metal pattern of a semiconductor device including the following steps. A Ti layer and a metal layer are formed on a semiconductor substrate or an insulating layer. Then, a wiring pattern including a Ti layer pattern and a metal layer pattern is formed by patterning the Ti layer and the metal layer. Then, a metal nitride layer is formed by depositing metal nitride on the wiring pattern. A metal nitride pattern is formed on side walls of the Ti layer pattern and the metal layer pattern by etching the metal nitride layer.

In the present invention, an exposed portion of a Ti layer, which has high reactivity and induces various problems while implementing other processes, is treated by a compound including nitrogen in advance to form a nitride layer to protect the Ti layer, and therefore, the various problems associated with the exposed Ti layer can be overcome.

BRIEF DESCRIPTION OF THE DRAWINGS

The above object and advantages of the present invention will become more apparent by describing preferred embodiments in detail with reference to the attached drawings in which.

DESCRIPTION OF THE PREFERRED EMBODIMENT

Hereinafter, the present invention will now be described more fully with reference to the accompanying drawings, in which preferred embodiments of the present invention are shown.

FIGS. 3A–3E are schematic cross-sectional views illustrating a method of manufacturing a metal pattern according to a first embodiment of the present invention.

Figure 3A:
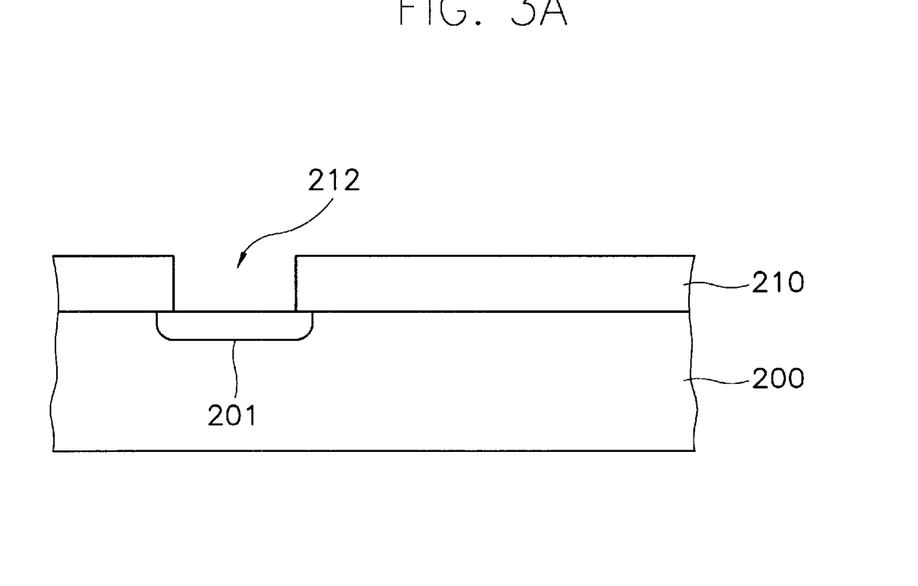
FIGS. 3A–3E are schematic cross-sectional views showing a method of manufacturing a metal pattern according to a first embodiment of the present invention.

Referring to FIG. 3A, an insulating layer 210 of silicon oxide is formed on a semiconductor substrate 200 in which an impurity doped region 201 is formed. An opening 212 which exposes the impurity doped region 201 is formed on the insulating layer 210 by a photolithography process.

Figure 3B:
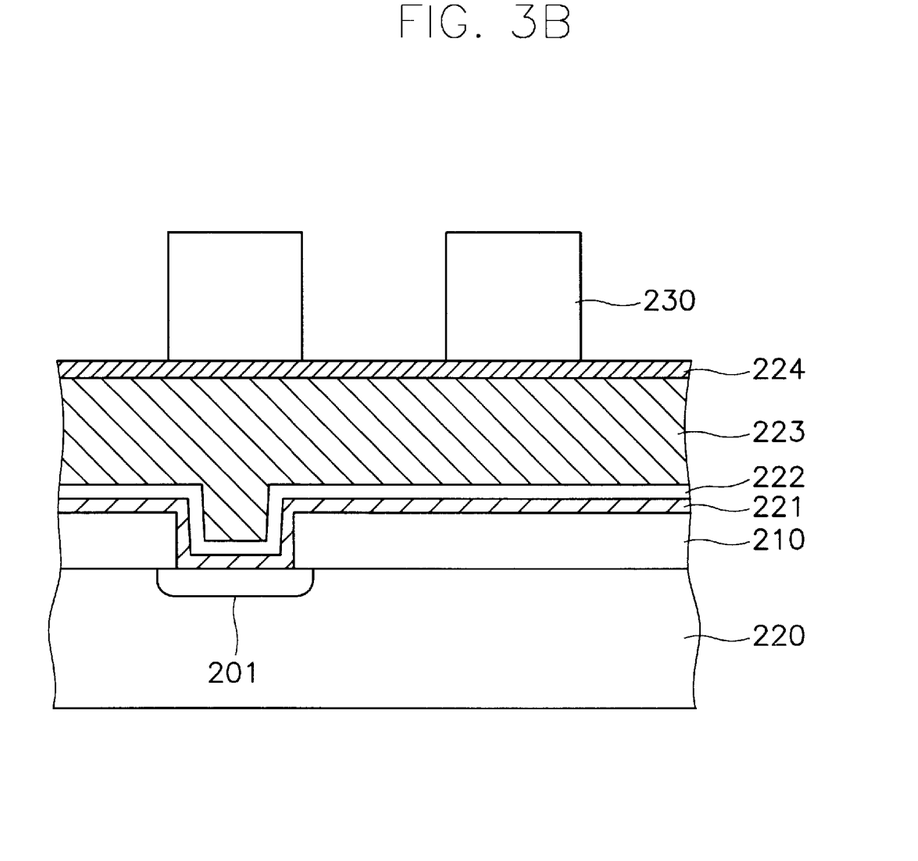

Referring to FIG. 3B, processes for forming a metal pattern are implemented. First, a Ti layer 221 is formed by depositing Ti by a sputtering method or a CVD method to a thickness of about 30–500 Å. The Ti layer functions to increase the adhesiveness between a subsequently deposited metal material and an underlying silicon oxide layer. On the Ti layer 221, a TiN (titanium nitride) layer 222 is formed as a barrier layer to a thickness of about 50–2000 Å. The TiN layer 222 is formed to prevent an impregnation of a subsequently deposited metal material to form a metal layer contacting the underlying active region. In general, a Ti/TiN layer is applied as a barrier layer between a silicon layer and a metal layer, while a Ti layer or TiN layer is applied between metal layers. Thereafter, a metal layer 223 is formed by depositing a metal such as tungsten, aluminum, or the like by a CVD method or a sputtering method to a thickness of about 300–8000 Å.

As for the metal material for forming the metal layer, tungsten, aluminum, aluminum-copper alloy, aluminumcopper-tungsten alloy, aluminum-scandium alloy, copper, cobalt, gold, silver, molybdenum, etc. can be used. Among them, tungsten is preferably applied because it has a low resistivity and a high melting point, and thus has good chemical vapor deposition characteristics and good step coverage. As for a tungsten source, tungsten hexafluoride ($WF_6$), having a boiling point at room temperature, is preferable to tungsten hexachloride ($WCl_6$), which has a high melting point and is in a solid state at room temperature.

Aluminum itself has a low melting point of 600° C., and a processing temperature for a mixture of aluminum and silicon is about 577° C. Therefore, processing at a high temperatures is difficult and voids will likely be generated in the resulting device. But, aluminum is cheaper than tungsten and has a low resistivity, and so a process control using aluminum is advantageous as well. Furthermore, aluminum has good reflow characteristics. Accordingly, aluminum is widely used as the metal material.

In the present invention, various materials can be used as the barrier layer including Ti/metal, such as Ti/TiN/W, Ti/W, Ti/TiN/Al, Ti/Al, etc. Copper has a high diffusion coefficient with respect to silicon oxide and silicon, and thus is not generally used as a barrier layer. For example, if copper is diffused into an insulating layer, the insulating layer becomes conductive thereby reducing the insulating characteristics. However, copper is cheap and has a low resistivity and so efforts continue for ways to successfully employ copper as a barrier layer.

On the metal layer 223, an SiN layer 224 is formed by depositing SiN. The SiN layer 224 is formed by depositing SiN in the presence of a mixed gas of $SiH_4$ and $N_2$, or a mixed gas of $SiH_4$ and $N_2O$, at about 400–600° C. using an LPCVD method. After that, a photoresist pattern 230 is formed by depositing, exposing and developing a photoresist layer using a typical photolithography process.

Figure 3C:
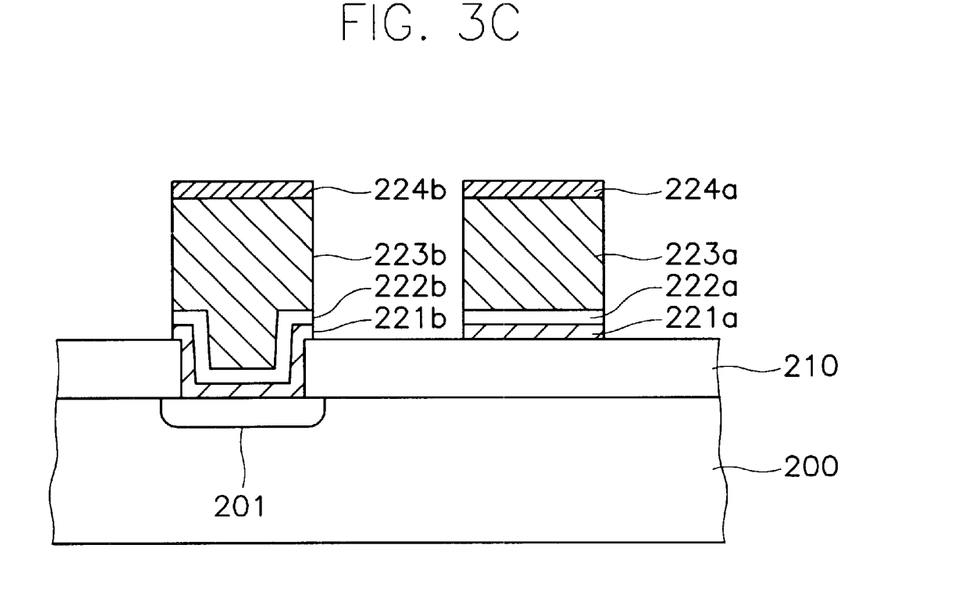

With reference to FIG. 3C, an anisotropic RIE (reactive ion etching) method is performed using the photoresist pattern 230 as an etching mask. Then, the photoresist layer 230 is removed to obtain desired patterns. The resulting patterns, starting with the uppermost layer, are an SiN pattern 224a, a metal layer pattern 223a, a TiN pattern 222a and a Ti pattern 221a. The SiN pattern 224a formed on the metal layer pattern 223a functions as an anti-reflective layer during the subsequently implemented photolithography process, and also functions to reinforce the shoulder of SiN spacers which will be formed at the sidewalls of a metal pattern.

Note that after forming the patterns, sidewalls of each pattern (i.e., Ti pattern sidewalls 221b, TiN pattern sidewalls 222b, metal layer pattern sidewalls 223b, and SiN pattern sidewalls 224b) are exposed. As shown in FIG. 3C, the Ti pattern 221a, which has a good reactivity and a weak stress, is positioned at the lowest portion, and the metal layer pattern 223a, which has a stronger stress than that of the Ti pattern 221a, is positioned above the Ti pattern 221a, with the TiN pattern 222a being interposed between them.

Figure 3D:
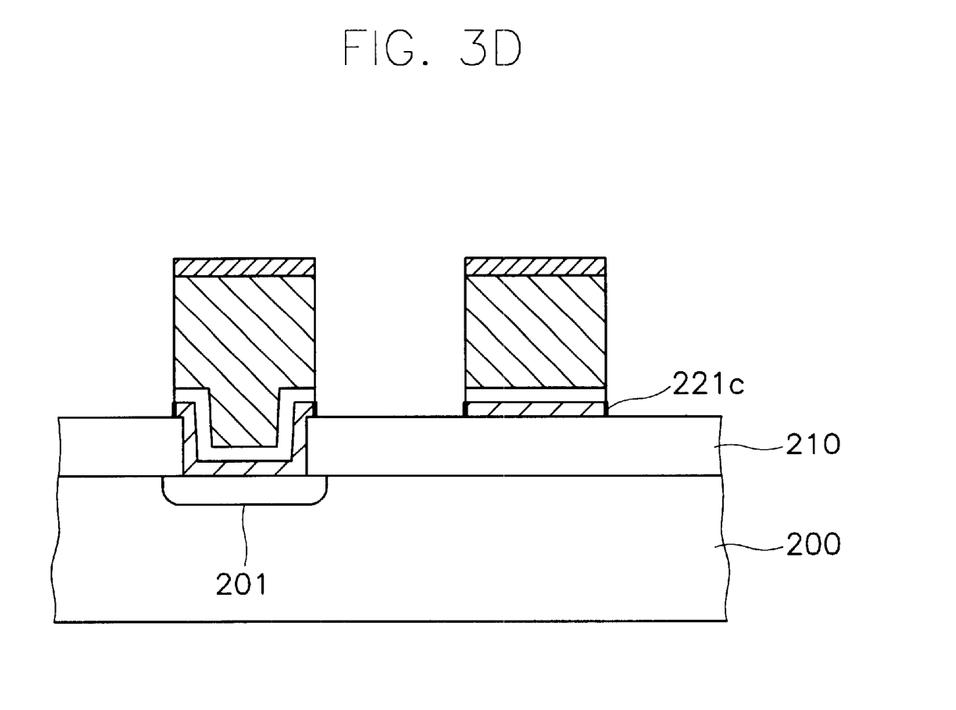

With reference to FIG. 3D, a TiN layer 221c is formed by heat treating in an atmosphere of a compound including nitrogen, thereby nitrifying an exposed sidewall 221b of the Ti pattern 221a. As for the compound including nitrogen, nitrogen gas, ammonia gas, a compound including nitrogen ions, or a compound including nitrogen atoms, can be used. In other words, any compounds which can react with the exposed Ti and form TiN on the surface of the Ti pattern can be used. The heat treating is implemented by an RTA (rapid thermal annealing) process or a furnace annealing process.

The precise parameters of the heat treating process can be modified according to the equipment employed. For example, the heat treating may take a shorter time when RTA equipment is used, because the desired temperature can be reached in a shorter time. Conversely, heat treating takes longer in a furnace because it takes longer to reach the desired temperature. Accordingly, the heat treating condition should be controlled so as to form the TiN layer 221c to a thickness of about 10–500 Å, and more preferably, 10–50 Å on the side walls of the Ti pattern 221a.

After repeated experiments, the present inventors found that the heat treating is preferably implemented by an RTA process under an atmosphere range of about $1\times10^{-10}$–760 torr, at a temperature range of about 500–750° C., for about 3–40 seconds. More preferably, the RTA process is implemented under atmospheric pressure at about 650° C. for about 20 seconds.

After the heat treating, the exposed portion of the Ti layer forms TiN as a main product. Sometimes, however, the presence of oxygen is inevitable in the heat treating environment. TiON can thus be formed as a byproduct of the heat treating under an atmosphere including both nitrogen and oxygen. However, the TiON byproduct does not affect the operation and objectives of the present invention, and thus an additional process to avoid the formation of TiON is not required. However, if an excessive amount of oxygen is supplied, undesirable $TiO_2$ can be formed and so the amount of oxygen should be controlled.

If heat treating is conducted in a furnace, it is preferably performed in the furnace annealing equipment under an atmosphere range of about $1\times10^{-10}$–760 torr, at a temperature range of about 500–750° C., for about 40–60 minutes.

Figure 3E:
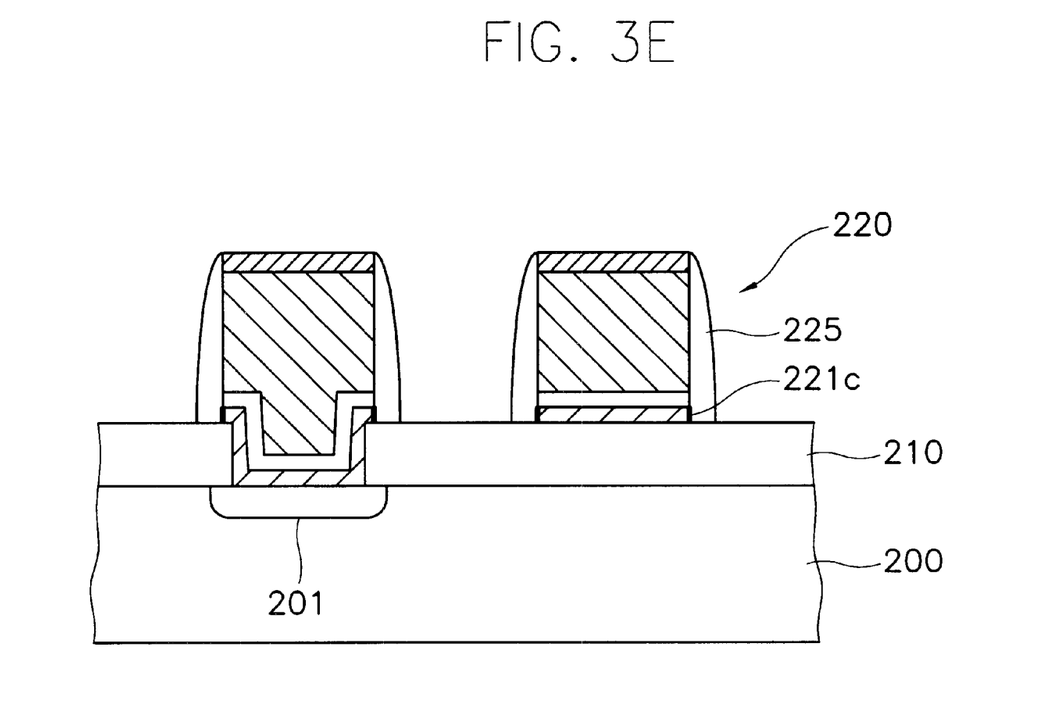

With reference to FIG. 3E, SiN is deposited on the thus obtained pattern at about 400–600° C. by the LPCVD method. Then, SiN spacers 225 are formed on side walls of the metal pattern by implementing an etch back process, and a metal pattern 220 having spacers on side walls thereof is formed. SiN spacers 225 prevent an oxidation of the metal and facilitates an SAC forming process. The formation of the SiN layer to form the SiN spacers 225 can be implemented after the heat treating in situ. The processes for nitrifying the exposed portion of the TiN layer and the subsequent formation of the SiN layer to form the SiN spacers are closely connected, thereby avoiding excessive delay in forming the nitride layer. According to this embodiment, since the process for forming the SiN spacers is implemented after the passivation process of the exposed Ti layer, the oxidation of the Ti layer during the subsequent heat treating can be overcome.

Figure 4:
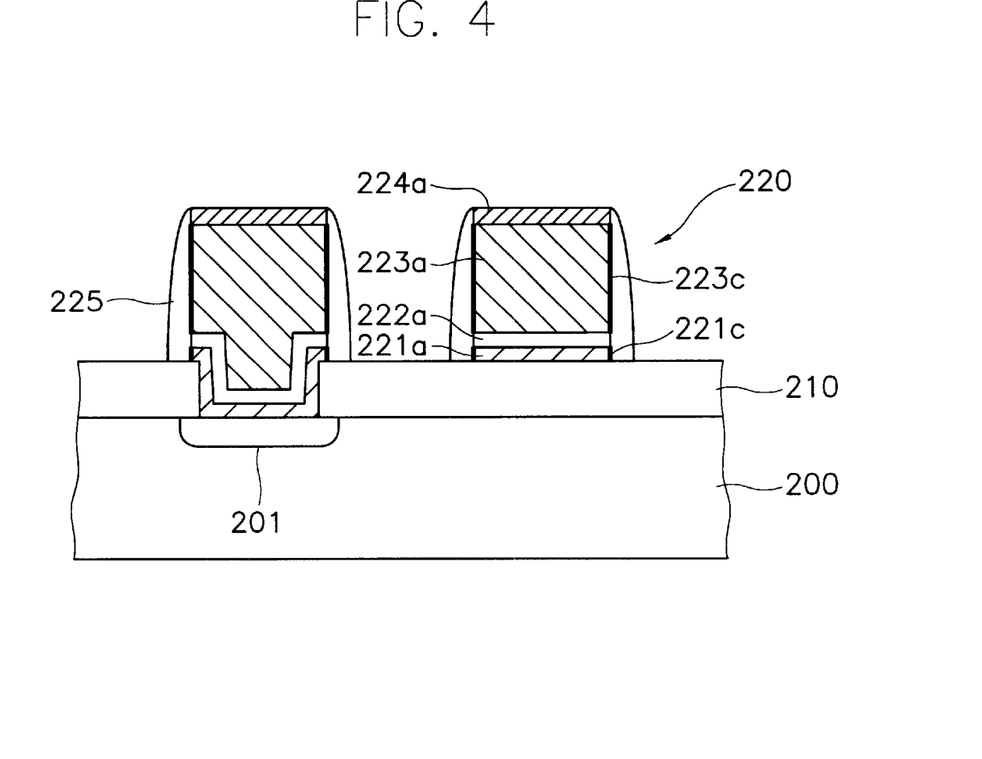
FIG. 4 is a cross-sectional view of a metal pattern manufactured by a second embodiment of the present invention.

FIG. 4 is a cross-sectional view of a metal pattern manufactured by a second embodiment of the present invention. During the heat treating to form the TiN layer on the side walls of the Ti layer (as in FIG. 3D), the exposed side walls of the metal layer 223b also can form a nitride compound 223c. The thickness of the nitride compound 223c depends on the reactivity with the metal according to the type of the metal be used. The metal nitride compound is preferable because it protects the metal layer and has no known negative effects.

As a third embodiment of the present invention, a metal nitride layer can be formed on the side walls of the metal pattern after the etching of the metal layer by using the photoresist pattern to prevent a generation of a defect due to an exposed Ti layer. The metal nitride layer is formed by depositing a metal nitride compound at a low temperature to a thickness of about 10–500 Å, and preferably to about 10–50 Å, and then implementing an etch back process until the surface of the substrate is exposed.

Figure 5A:
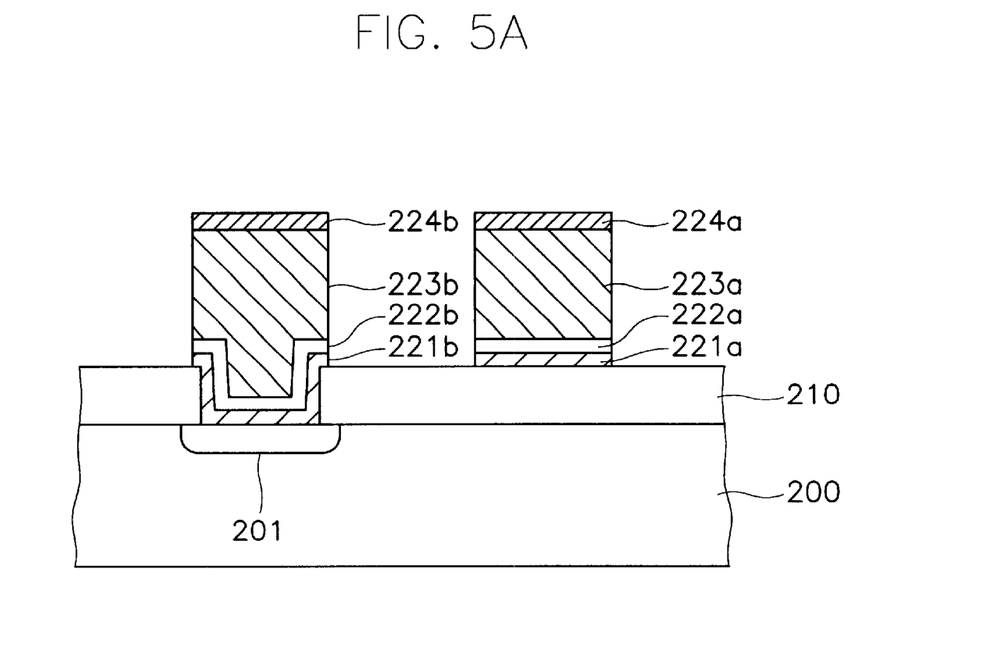
FIGS. 5A–5C are cross-sectional views showing a method of manufacturing a metal pattern according to a third embodiment of the present invention.
Figure 5B:
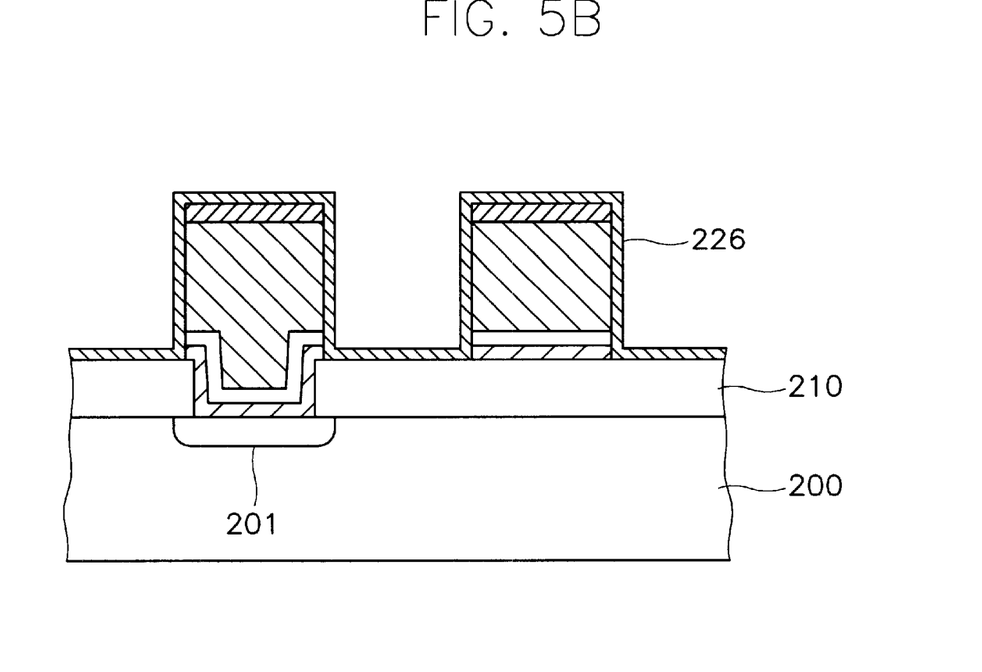
Figure 5C:
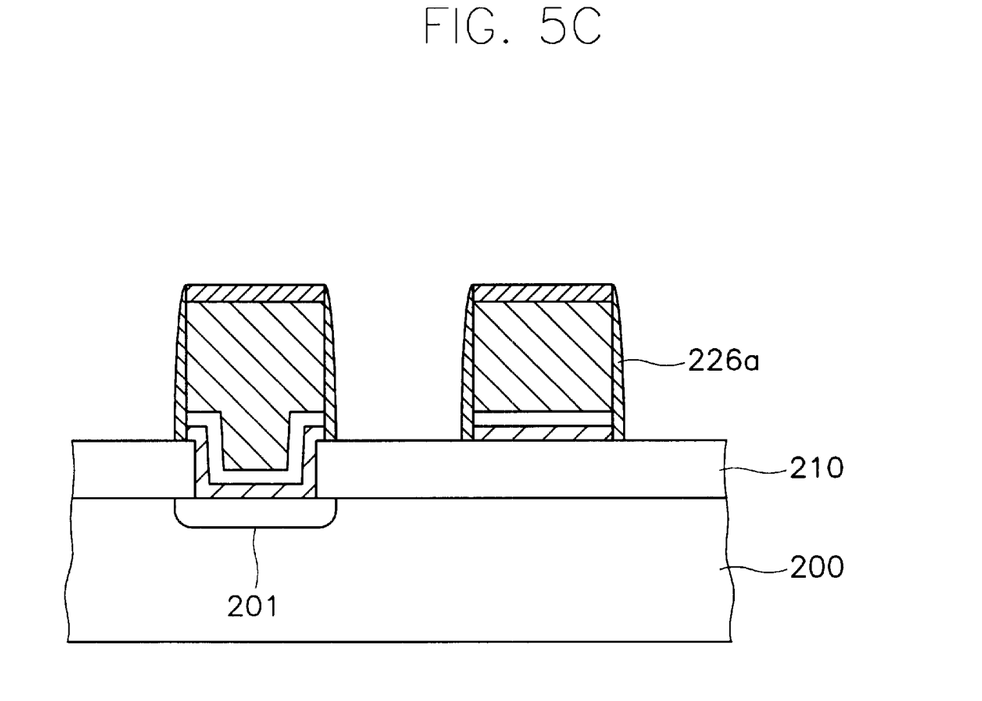

More specifically, FIGS. 5A–5C are cross-sectional views showing a method of manufacturing a metal pattern according to the third embodiment of the present invention.

With reference to FIG. 5A, an SiN pattern 224a, a metal layer pattern 223a, a TiN pattern 222a, and a Ti pattern 221a are formed in the same manner as described with regard to FIG. 3C. After forming these patterns, the side walls of each pattern are exposed as described previously.

With reference to FIG. 5B, TiN is deposited on the thus obtained etched pattern, by a sputtering method or a CVD method, to a thickness of about 10–500 Å, and preferably to a thickness of about 50 Å to form a thin TiN layer 226.

With reference to FIG. 5C, an etch back process is implemented until the substrate is exposed to form a TiN pattern 226a which has a spacer shape, on the side walls of the etched pattern. Then, SiN is deposited on the thus obtained pattern and an etch back process is implemented to form an SiN spacer on side walls of the metal pattern. The SiN spacer functions to prevent an oxidation of the metal and reinforces an SAC process.

According to this embodiment, the metal nitride is additionally deposited and then etched, which increases the complexity of the process. However, this additional nitride layer improves the adhesiveness and stability of the metal pattern. Considering these effects, the more complex process can be readily applied. As for the metal nitride compounds, TiN, WN, and the like can be used. More preferably, the deposition of the metal nitride compounds is implemented under an atmosphere of a compound including nitrogen.

The preferred embodiments of the present invention were explained with reference to the formation of a bit line, in which the metal pattern is formed on a substrate or an insulating layer. However, the metal pattern also can be formed on an interlayer dielectric for an interconnection. In addition, the present invention can be applied to all types of devices including a metal pattern having a barrier layer, for example, a DRAM, SRAM, CMOS, Bi-MOS, MOSFET, etc.

While a nitride layer is formed on an exposed portion of a Ti layer, which has a high reactivity and functions as a protecting layer according to the method of the present invention, it should be understood that the present invention can be applied to other metal layers if the spirit of the present invention is utilized to solve the problems as described herein.

According to the present invention, the decrease in the stability or adhesiveness of a metal pattern, attributed to an indirect influence of a subsequent thermal process, can be overcome and a metal pattern of a semiconductor device having good stability and adhesion qualities can be manufactured.

In addition, since the formation of the nitride layer on side walls of the metal pattern is separately implemented, this process does not affect other processes. Accordingly, the Ti layer can be effectively protected without accompanying side-effects or adverse consequences.

Furthermore, since the heat treating under an atmosphere of a compound including nitrogen is implemented after the etching of the metal pattern and before the subsequent thermal process, the Ti layer which has a high reactivity can be protected. At the same time, the heat treating at a high temperature induces the generation of gas from surrounding layers, such as the insulating layer, to reduce an amount of gas generated during the subsequent thermal process. Therefore, even if ten or more wafers are subjected to the thermal process, a lifting of the metal layer rarely occurs.

While the present invention is described in detail referring to the attached embodiments, various modifications, alternate constructions and equivalents may be employed without departing from the true spirit and scope of the present invention.

What is claimed is:

1. A method of manufacturing a metal pattern of a semiconductor device comprising:
    forming a Ti layer and a metal layer on a substrate;
    forming a wiring pattern including a Ti layer pattern and a metal layer pattern by patterning said Ti layer and said metal layer;
    forming a metal nitride layer by depositing metal nitride on said wiring pattern; and
    etching said metal nitride layer to form a metal nitride pattern on exposed side walls of said Ti layer pattern and said metal layer pattern.

2. The method as claimed in claim 1, wherein said metal nitride is one of TiN and WN.

3. The method as claimed in claim 2, wherein the substrate is one of a semiconductor substrate and an insulating layer.

4. A method of manufacturing a metal pattern of a semiconductor device comprising:
    sequentially forming a Ti layer and then a metal layer on a substrate;
    patterning and etching said Ti layer and said metal layer to form a wiring pattern that includes a Ti layer pattern and a metal layer pattern having exposed sidewalls;
    after said Ti layer and said metal layer have been patterned and etched to form said wiring pattern, heat treating said wiring pattern, under an atmosphere of a compound including nitrogen, to react the Ti of said Ti layer and thereby form TiN as a main product on the exposed sidewalls of said Ti layer pattern; and
    subsequently forming spacers of insulating material over the sidewalls of said Ti layer pattern, constituted by the TiN, and of said metal layer pattern.

5. The method as claimed in claim 4, wherein said heat treating is implemented for a time period sufficient to form a TiN layer having a thickness of about 10–500 Å on the exposed sidewalls of said Ti layer pattern.

6. The method as claimed in claim 5, wherein said heat treating comprises rapid thermal annealing (RTA) the wiring pattern under an atmosphere range of about $1\times10^{-10}$–760 torr, at a temperature range of about 500–750° C., for about 3–40 seconds.

7. The method as claimed in claim 5, wherein said heat treating comprises annealing the wiring pattern in a furnace under an atmosphere range of about $1\times10^{-10}$–760 torr, at a temperature range of about 500–750° C., for about 40–60 minutes.

8. A method of manufacturing a metal pattern of a semiconductor device comprising:

sequentially forming a Ti layer, a TiN layer and then a metal layer on a substrate;

patterning and etching said Ti layer, said TiN layer and said metal layer to form a wiring pattern that includes a Ti layer pattern, a TiN layer pattern and a metal layer pattern having exposed sidewalls; and after said Ti layer, said TiN layer and said metal layer have been patterned and etched to form said wiring pattern, heat treating said wiring pattern, under an atmosphere of a compound including nitrogen, to react the Ti of said Ti layer and thereby form TiN as a main product on the exposed sidewalls of said Ti layer pattern.

9. The method as claimed in claim 8, wherein said Ti layer is formed to a thickness of about 30–500 Å.

10. The method as claimed in claim 8, wherein said TiN layer is formed to a thickness of about 50–2000 Å.

11. The method as claimed in claim 8, wherein said heat treating is implemented for a time period sufficient to form the TiN layer to a thickness of about 10–500 Å at the exposed sidewalls of said Ti layer pattern.

12. The method as claimed in claim 11, wherein said heat treating comprises rapid thermal annealing (RTA) of the wiring pattern under an atmosphere range of about $1\times10^{-10}$–760 torr, at a temperature range of about 500–750° C., for about 3–40 seconds.

13. The method as claimed in claim 11, wherein said heat treating comprises annealing the wiring pattern in a furnace under an atmosphere range of about $1\times10^{-10}$–760 torr, at a temperature range of about 500–750° C., for about 40–60 minutes.

14. The method as claimed in claim 8, and further comprising forming an SiN layer on said metal layer, and wherein said SiN layer is patterned and etched during said patterning and etching said Ti layer, said TiN layer and said metal layer.

15. A method of manufacturing a metal pattern of a semiconductor device comprising:

sequentially forming a Ti layer, a metal layer and then an SiN layer on a substrate;

patterning and etching said Ti layer, said metal layer and said SiN layer to form a wiring pattern that includes a Ti layer pattern, a metal layer pattern and an SiN layer pattern having exposed sidewalls; and after said Ti layer, said metal layer and said SiN layer have been patterned and etched to form said wiring pattern, heat treating said wiring pattern, under an atmosphere of a compound including nitrogen, to react the Ti of said Ti layer and thereby form TiN as a main product on the exposed sidewalls of said Ti layer pattern.

16. The method as claimed in claim 15, wherein said heat treating is implemented for a time period sufficient to form a TiN layer having a thickness of about 10–500 Å on the exposed sidewalls of said Ti layer pattern.

17. The method as claimed in claim 16, wherein said heat treating comprises rapid thermal annealing (RTA) the wiring pattern under an atmosphere range of about $1\times10^{-10}$–760 torr, at a temperature range of about 500–750° C., for about 3–40 seconds.

18. The method as claimed in claim 16, wherein said heat treating comprises annealing the wiring pattern in a furnace under an atmosphere range of about $1\times10^{-10}$–760 torr, at a temperature range of about 500–750° C., for about 40–60 minutes.

\* \* \* \* \*